United States Patent
Blackwell et al.

(10) Patent No.: US 10,782,326 B2
(45) Date of Patent: *Sep. 22, 2020

(54) EMULATING A CONSTANT POWER LOAD USING A CONSTANT CURRENT LOAD

(71) Applicant: International Business Machines Corporation, Armonk, NY (US)

(72) Inventors: Edward L. Blackwell, Four Oaks, NC (US); Adrian P. Glover, Katy, TX (US); David Rico, Houston, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/512,446

(22) Filed: Jul. 16, 2019

(65) Prior Publication Data
US 2019/0339310 A1   Nov. 7, 2019

Related U.S. Application Data

(63) Continuation of application No. 15/478,667, filed on Apr. 4, 2017.

(51) Int. Cl.
*G01R 21/06* (2006.01)
*G05B 15/02* (2006.01)
(Continued)

(52) U.S. Cl.
CPC .............. *G01R 21/06* (2013.01); *G01R 31/40* (2013.01); *G05B 15/02* (2013.01); *H02J 13/00* (2013.01);
(Continued)

(58) Field of Classification Search
CPC ..................................................... G01R 21/06
See application file for complete search history.

(56) References Cited

U.S. PATENT DOCUMENTS

| 4,037,156 A | 7/1977 | Goujon et al. |
| 4,357,574 A | 11/1982 | Takamisawa et al. |

(Continued)

FOREIGN PATENT DOCUMENTS

| WO | 2012173707 A2 | 12/2012 |
| WO | 2013099837 A1 | 7/2013 |
| WO | 2016010693 A1 | 1/2016 |

OTHER PUBLICATIONS

Collin, et al., "Component-based Aggregate Load Models for Combined Power Flow and Harmonic Analysis", 7th Mediterranean Conference and Exhibition on Power Generation, Transmission, Distribution and Energy Conversion, pp. 1-10, Nov. 7-10, 2010, Agia Napa, Cyprus (Paper No. MED10/171).

(Continued)

*Primary Examiner* — Walter L Lindsay, Jr.
*Assistant Examiner* — Milton Gonzalez
(74) *Attorney, Agent, or Firm* — James L. Olsen

(57) ABSTRACT

A method, computer program product, and system for emulating a constant power (CP) electronic load (e-load) from a constant current (CC) e-load are disclosed. Testing metrics may be obtained for a power source to be tested, including one or more power thresholds. Further, an initial current level for a CC e-load may be obtained. The power-draw of the CC e-load connected to the power source may be determined. The determined power-draw may be compared to at least one of the one or more of the power thresholds. In response to the power-draw not satisfying the at least one power threshold, the current level of the CC e-load may be adjusted based on the power-draw and the at least one power threshold.

20 Claims, 6 Drawing Sheets

(51) Int. Cl.
*H02J 13/00* (2006.01)
*G01R 31/40* (2020.01)

(52) U.S. Cl.
CPC ........... *Y02E 60/74* (2013.01); *Y02E 60/7853* (2013.01); *Y04S 10/30* (2013.01); *Y04S 40/126* (2013.01)

(56) References Cited

U.S. PATENT DOCUMENTS

| | | |
|---|---|---|
| 8,487,581 B2 | 7/2013 | Tan et al. |
| 8,589,110 B2 | 11/2013 | Liu et al. |
| 8,706,309 B2 | 4/2014 | Schweitzer, III et al. |
| 10,168,366 B2 | 1/2019 | Blackwell et al. |
| 2007/0194759 A1 | 8/2007 | Shimizu et al. |
| 2011/0199058 A1 | 8/2011 | Shoytush et al. |
| 2012/0126755 A1 | 5/2012 | Perisic et al. |
| 2013/0308240 A1 | 11/2013 | Yu et al. |
| 2014/0254221 A1 | 9/2014 | Johnson et al. |
| 2016/0172968 A1 | 6/2016 | Lin |
| 2018/0284166 A1 | 10/2018 | Blackwell et al. |
| 2018/0284167 A1 | 10/2018 | Blackwell et al. |

OTHER PUBLICATIONS

IBM, List of IBM Patents or Patent Applications Treated as Related, Jul. 15, 2019, 2 pages.

Voltage Meter CP Feedback Loop Run

| Time (s) | Sampling Rate (Samples/s) | Power Threshold (W) | Current (A) | Measured Voltage (V) | Current Adjustment (A) | Power Inference (W) |
|---|---|---|---|---|---|---|
| 0.00 | 1.00 | 1,400 | 140.00 | 10.0 | 0.00 | 1400 |
| 1.00 | 1.00 | 1,400 | 140.00 | 10.2 | -2.75 | 1428 |
| 2.00 | 1.00 | 1,400 | 137.25 | 10.5 | -3.92 | 1441 |
| 3.00 | 1.00 | 1,400 | 133.33 | 10.8 | -40.74 | 1440 |
| 4.00 | 2.00 | 1,000 | 92.59 | 11.0 | -1.68 | 1019 |
| 4.50 | 2.00 | 1,000 | 90.91 | 11.2 | -1.62 | 1018 |
| 5.00 | 2.00 | 1,000 | 89.29 | 11.4 | -1.57 | 1018 |
| 5.50 | 2.00 | 1,000 | 87.72 | 11.6 | -44.62 | 1018 |
| 6.00 | 4.00 | 500 | 43.10 | 11.7 | -0.37 | 504 |
| 6.25 | 4.00 | 500 | 42.74 | 11.9 | -0.72 | 509 |
| 6.50 | 4.00 | 500 | 42.02 | 12.0 | -0.35 | 504 |
| 6.75 | 4.00 | 500 | 41.67 | 12.2 | -0.68 | 508 |
| 7.00 | 8.00 | 500 | 40.98 | 12.4 | N/A | 508 |

FIG. 4

Power Meter CP Feedback Loop Run

| Time (s) | Sampling Rate (Samples/s) | Power Threshold (W) | Current (A) | Measured Power (W) | Current Adjustment (A) | Voltage Inference (V) |
|---|---|---|---|---|---|---|
| 0.00 | 1.00 | 1,400 | 116.66 | 1395 | 0.42 | 11.96 |
| 1.00 | 1.00 | 1,400 | 117.08 | 1397 | 0.25 | 11.93 |
| 2.00 | 1.00 | 1,400 | 117.33 | 1393 | 0.59 | 11.87 |
| 3.00 | 1.00 | 1,400 | 117.92 | 1390 | -33.09 | 11.79 |
| 4.00 | 2.00 | 1,000 | 84.83 | 996 | 0.34 | 11.74 |
| 4.50 | 2.00 | 1,000 | 85.17 | 997 | 0.26 | 11.71 |
| 5.00 | 2.00 | 1,000 | 85.43 | 995 | 0.43 | 11.65 |
| 5.50 | 2.00 | 1,000 | 85.86 | 994 | -42.67 | 11.58 |
| 6.00 | 4.00 | 500 | 43.19 | 500 | 0.00 | 11.58 |
| 6.25 | 4.00 | 500 | 43.19 | 498 | 0.17 | 11.53 |
| 6.50 | 4.00 | 500 | 43.36 | 499 | 0.09 | 11.51 |
| 6.75 | 4.00 | 500 | 43.45 | 498 | 0.17 | 11.46 |
| 7.00 | 8.00 | 500 | 43.62 | 497 | N/A | 11.39 |

FIG. 5

EMULATING A CONSTANT POWER LOAD USING A CONSTANT CURRENT LOAD

BACKGROUND

The present disclosure relates generally to the field of electronics, and more particularly to power source testing.

Power sources, such as power supply units (PSU's), batteries, generators, solar cells, fuel cells, and uninterruptible power supplies (UPS's), may provide power to electrical loads. Electrical loads may be designed to test power source performance. For example, a constant current (CC) electronic load may draw a predefined, constant current from the power source to test power performance.

SUMMARY

Embodiments of the present disclosure include a method, computer program product, and system for emulating a constant power (CP) electronic load (e-load) using a constant current (CC) e-load. The method may include obtaining testing metrics for a power source to be tested, including one or more power thresholds. Further, the method may include obtaining an initial current level for a CC e-load. The method may further include determining power-draw of the CC e-load connected to the power source. The determined power-draw may be compared to at least one of the one or more of the power thresholds. The method may include adjusting, in response to the power-draw not satisfying the at least one power threshold, the current level of the CC e-load based on the power-draw and the at least one power threshold.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

FIG. 4 illustrates an example data run completed by an application implementing a CP feedback loop with measurements obtained by a voltage meter.

FIG. 5 illustrates an example data run completed by an application implementing a CP feedback loop with measurements obtained by a power meter.

Figure 1:
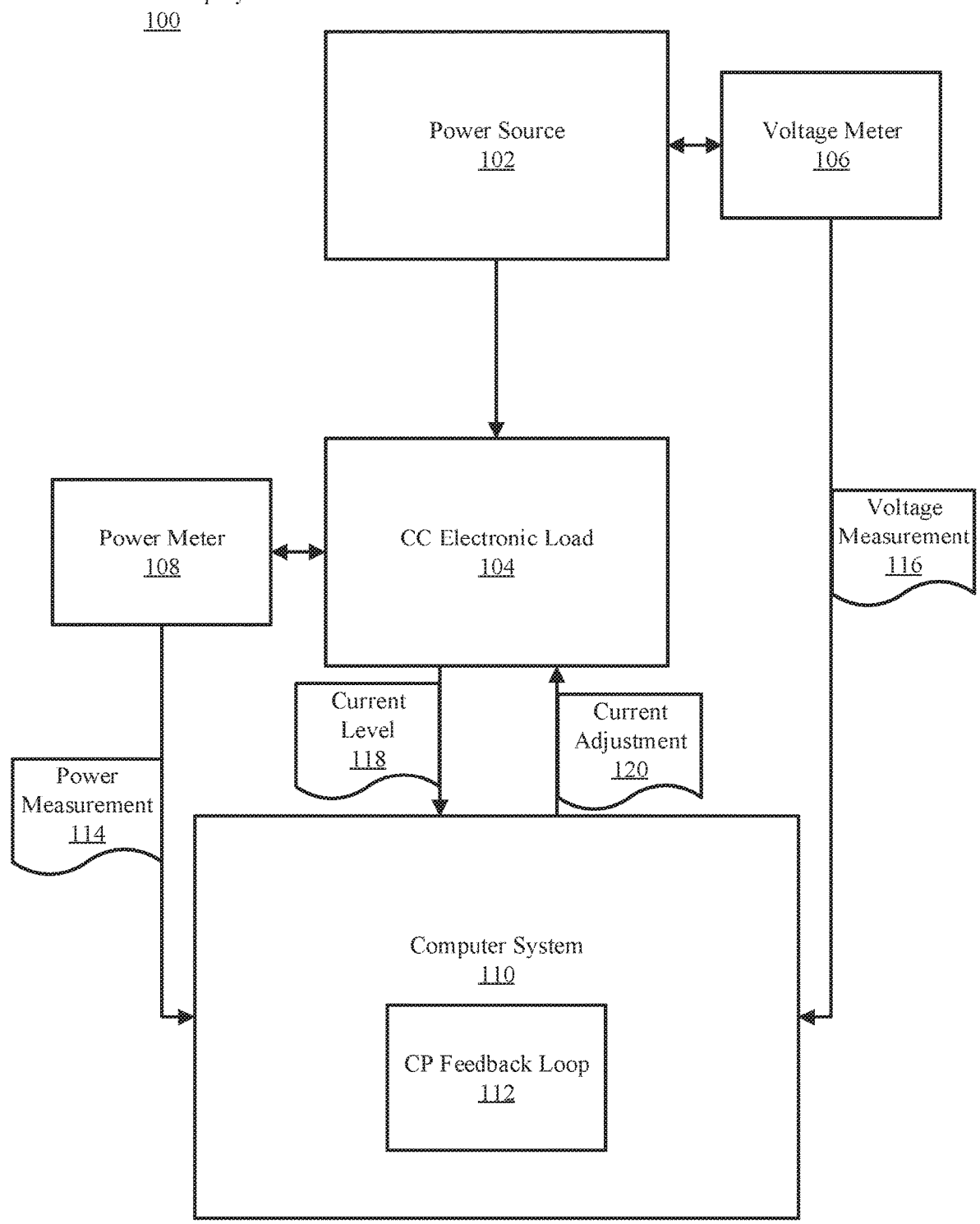
FIG. 1 illustrates a constant power (CP) feedback loop system utilizing a constant current (CC) electronic load (e-load), in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of electronics, and in particular to power source testing. While the present disclosure is not necessarily limited to such applications, various aspects of the disclosure may be appreciated through a discussion of various examples using this context.

Electronic loads (e-loads) for testing purposes may be configured with a variety of different modes, depending on their internal circuitry. Some e-loads have a constant current (CC) mode, in which the e-load draws a specific amount of current from a power source (e.g., a battery). Some e-loads include a constant voltage (CV) mode, in which the e-load draws the amount of current required for the voltage across the input terminals of the power source to be what a user specified. E-loads may also include a constant power (CP) mode, in which the load measures the input voltage of the power source, and adjusts the current draw such that the measured power approaches a specified power drain according to Equation (1), as seen below.

$$\text{Power}(P) = \text{Voltage}(V) \times \text{Current}(I) \qquad \text{Equation (1)}$$

E-loads with a CP option may be expensive due to the internal circuitry and firmware associated with the load. Because some power sources (e.g., batteries and unregulated power supplies) may have varying output voltage over time, CP loads include circuitry configured to vary current over time depending on output voltage fluctuations. This enables a CP e-load to adaptively alter current depending on voltage change to maintain a constant power according to Equation (1).

On the other hand, CC e-loads are less expensive and more readily available; however, CC e-loads may not be well suited for testing varying voltage output power sources. For example, output voltage may fluctuate over time in batteries when the cells warm up (e.g., reaction kinetics tend to increase the output voltage) or when energy is depleted, which tends to lower the voltage. When attempting to measure a power profile (e.g., a power vs. time scatter plot) specified in units of power (e.g., watts), as the voltage output changes at a constant current drain, the target power profile may be inaccurate. Accordingly, CC e-loads may not be well suited for power level testing of varying voltage output power sources.

Embodiments of the present disclosure relate to using an application to administer a feedback loop to emulate a CP e-load using a CC e-load with a variable constant current. Because the voltage drop may be gradual in certain varying voltage power sources, such as batteries, expensive CP loads may not be required. By interfacing a CC e-load with a computer system, while running an application capable of altering current level and also obtaining power measurements, a slow feedback loop may be generated to effectively emulate a CP e-load using a CC e-load. For example, if a processor determines that the power drawn by the CC e-load is lower than a desired target power threshold, the application may be configured to increase the current level of the CC e-load. Conversely, if the power drawn from the power source is higher than the desired target power threshold, the application may be configured to decrease the current of the CC e-load. In both situations, the observed power level is altered to approach a target power threshold (e.g., satisfy a power threshold).

FIG. 1 illustrates a CP feedback loop system 100, in accordance with embodiments of the present disclosure. The CP feedback loop system 100 may include a CC e-load 104 connected to a power source 102 and communicatively coupled with a computer system 110. The CC e-load 104 may be electrically connected to the power source 102, so that the CC e-load 104 draws a constant current from the power source 102. The CC e-load 104 may be communicatively coupled with the computer system 110. This may allow the CC e-load 104 to transmit current levels 118 to the computer system 110 and receive current adjustments 120 from the computer system 110.

The CP feedback loop system 100 may include a voltage meter 106. The voltage meter 106 may be communicatively coupled to the computer system 110 to transmit voltage measurements 116 to a CP feedback loop 112 located on the computer system 110. In some embodiments, the CP feedback loop system 100 may include power meter 108 instead of, or in addition to, the voltage meter 106. The power meter 108 may be communicatively coupled to the computer system 110 to transmit power measurements 114 to the CP feedback loop 112 located on the computer system 110. In some embodiments, the CP feedback loop 112 may be an application running on the computer system 110.

The power source 102 output voltage may vary over time. For example, in some embodiments, the power source 102 may be a battery. In these embodiments, the voltage output may increase over time due to the power cells warming up (e.g., increasing the reaction kinetics). Further, in these embodiments the voltage output may decrease over time due to the battery energy being depleted. Accordingly, the voltage meter 106 may report voltage measurements 116 to the computer system 110.

A user may test the power source 102 performance at specified power thresholds (e.g., defined power levels for testing, for example, a number of watts). For example, a user may desire to know power source 102 performance in typical environments in which the power source 102 will be implemented. Accordingly, the power thresholds may, in some embodiments, mirror the environment in which the power source 102 will be used. For example, if the power source 102 is a car battery (e.g., 12V, 40 Ah lead-acid battery), the power threshold may be 480 W. As such, the CC e-load 104 may be configured to draw 480 W over 1 hour as a power profile (e.g., the power profile may include testing the power supply 102 at the power threshold over a period of time.) However, if the power source 102 is a phone battery (e.g., 3.7 V, 1.5 Ah lithium-ion battery), the power threshold may be 5 W. As such, the CC e-load 104 may be configured to draw 5 W over multiple hours as a power profile. Further, specified power thresholds may include idle power draws (e.g., when the battery power draw is at a minimum). The specified power thresholds may also include peak power draws (e.g., when the battery reaches capacity power draw). However, any suitable power thresholds may be defined according to power source 102 testing requirements.

The CP feedback loop 112 may send current adjustments 120 to the CC e-load 104 based on voltage measurements 116 obtained by the voltage meter 106. The current adjustments 120 may be transmitted to the CC e-load 104 to satisfy power thresholds. For example, a user may set a power profile for a battery to be 5 W over one hour. In this example, if the battery has a 5V output voltage, the user may set an initial current draw of 1 amp from the CC e-load 104 to match the target power threshold, according to Equation (1) (e.g., 5 W=5V×1 A). Over time, the voltage of the battery may increase to 6V, as measured by the voltage meter 106. The 6V voltage measurement 116 may be sent to the CP feedback loop 112, and the CP feedback loop 112 may adjust current accordingly. In this example, if the CP feedback loop 112 receives a voltage measurement 116 of 6V, the CP feedback loop 112 may transmit a current adjustment 120 of −0.166 A to the e-load, effectively lowering the constant current drawn to 0.834 A, to maintain a 5 W power draw (e.g., 5 W=6V×(1 A−0.166 A)).

Alternatively, the CP feedback loop 112 may send current adjustments 120 to the CC e-load 104 based on power measurements 114 obtained by power meter 108. In some embodiments, the CP feedback loop 112 may compare the power measurement 114 obtained by the power meter 108 to specified power thresholds, and adjust the current drawn from the CC e-load 104 according to the comparison. For example, a user may set a power profile for a battery to be 400 W over one hour. If the battery has a 20V output, the user may set an initial current draw of 20 A from the CC e-load 104 to match the target power threshold, according to Equation (1) (e.g., 400 W=20V×20 A). However, over time, the voltage of the battery may decrease to 15V, due to energy of the battery being depleted (e.g., due to the reaction being exhausted). Accordingly, the power meter 108 may transmit a power measurement 114 of 300 W (300 W=15V×20 A) to the CP feedback loop 112. The CP feedback loop 112 may compare the observed power draw of 300 W to the target power threshold of 400 W, and send a current adjustment 120 to the CC e-load 104 to approach the target power threshold. In this example, the CP feedback loop 112 may send a current adjustment 120 of +6.66 A to the CC e-load 104, to satisfy the target power threshold (e.g., 400 W=15V× (20 amps+6.66 amps)).

In some embodiments, either a voltage meter 106 or a power meter 108 may be used to calculate current adjustments 120 by the CP feedback loop 112. However, in some embodiments, both a voltage meter 106 and a power meter 108 may be used. This may allow a user to cross reference voltage output values from the power source 102 to determine an average voltage output value. Further, at least two voltage meters 106 and/or at least two power meters 108 may be implemented, to increase the number of measurements obtained. This may increase the accuracy of the measurements provided to the CP feedback loop 112, as the sampling size is increased. Any suitable number or arrangement of voltage meters 106 and power meters 108 may be implemented. In embodiments where multiple meters are used, the average, median, highest, or lowest measurement generated by the two or more meters may be used.

Any suitable voltage meter 106 may be used. In some embodiments, an analog voltage meter 106 may be used. This may provide accuracy within a few percent of the full scale voltage measurement 116. In some embodiments, a digital voltage meter 106 may be used. This may provide high accuracy voltage measurements 116, typically within 1 percent of the full scale voltage value. Further, the voltage meter 106 may be an integral part of the power source 102, the computer system, or the CC e-load 104. This may reduce the number of external components associated with the system. Any suitable means for connecting a voltage meter to the power source 102, the CC e-load 104, and/or the computer system 110 may be used. In some embodiments, the voltage meter 106 may be connected directly to the CC e-load 104, and the voltage measurements may be transmitted to the computer system 110 through the CC e-load 104.

Any suitable power meter 108 may be used, including digital and analog power meters. In some embodiments, the power meter 108 may include both voltage and current measurements. This may allow a user to cross reference observed current measurements against predefined current values set on the CC e-load 104. Further, this may allow a user to compare power meter 108 voltage values against voltage meter 106 voltage measurements 116. In some embodiments, the power meter 108 may be integral with the CC e-load 104 or computer system 110. Any suitable means for connecting a power meter to the CC e-load 104 and/or computer system 110 may be used. In some embodiments, the power meter 108 may be connected directly to the CC e-load 104, and the power measurements may be transmitted to the computer system 110 through the CC e-load.

The CC e-load 104, voltage meter 106, and power meter 108 may be communicatively coupled to the computer system 110 in any manner. Various connections may be used, including Universal Serial Bus (USB), Serial Advanced Technology Attachment (SATA), eSATA, Ethernet, General Purpose Interface Bus (GPIB), FireWire, BLUETOOTH (BLUETOOTH SIG, INC. CORPORATION DELAWARE 5209 Lake Washington Boulevard NE Suite 350 Kirkland Wash. 98033), WiFi, WiMax, or ZIGBEE (ZigBee Alliance CORPORATION CALIFORNIA 2400 Camino Ramon, Suite 375 San Ramon Calif. 94583). Wired connections may be advantageous as they provide control, security, reliability, and speed depending on the selected connection. In wired examples, there is less risk data transfer will be disconnected due to poor connection, the flow may be consistent and selective, and there may be less risk of data interception. There may also be speed advantages, as data transfer may occur with lower latency, and without the risk of wireless interference. Wireless connections, such as Bluetooth, may be advantageous as they reduce problems associated with wired systems, such as cord congestion or bent cables. Furthermore, wireless connections may be configured to provide data transfer over longer distances, without requiring long spanning cables.

The power source 102 may be a battery, power supply, uninterruptable power supply, fuel cell, solar cell, or any other suitable power source 102. In some embodiments, power sources 102 may be tested to determine whether they maintain a constant voltage over time, to determine how long the battery is likely to last under various test conditions (e.g., under conditions similar to normal use), or for any other purpose (e.g., to test whether the batteries get too hot or are unsafe under certain conditions). For example, a battery meant for a phone may be tested to determine whether it is likely to catastrophically fail (e.g., ignite or become unreasonably hot) under specific conditions. In some embodiments, power sources 102 may be monitored to determine their relative voltage change over time, including the cause of the voltage change. Further, in some embodiments, power sources 102 may be tested for performance at specified power thresholds (e.g., defined power level values for testing, a number of watts). Additionally, power sources 102 may be tested to determine their energy capacity and depletion over time.

Figure 2:
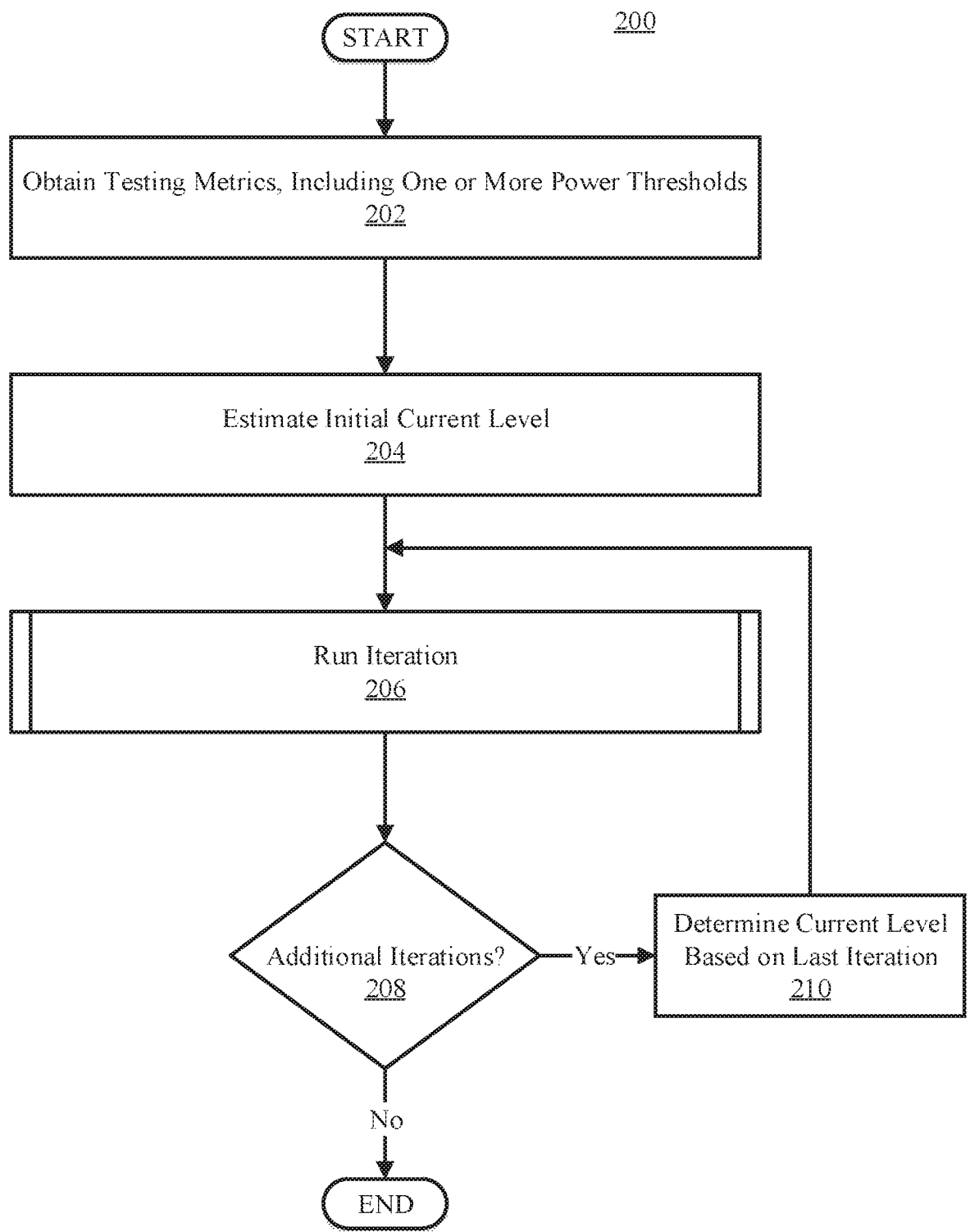
FIG. 2 illustrates a flowchart of an example method for running one or more iteration(s) of a CP feedback loop using a CC e-load connected to a power source, in accordance with embodiments of the present disclosure.

FIG. 2 illustrates a flowchart of an example method 200 for running one or more iteration(s) of a CP feedback loop on a CC e-load connected to a power source, in accordance with embodiments of the present disclosure. The example method 200 may be performed by a processor. In some embodiments, one or more operations of method 200 may be performed by a user, or by the processor in response to user input. The CC e-load, power source, voltage meter, power meter, and CP feedback loop may be substantially the same as the CC e-load 104, power source 102, voltage meter 106, power meter 108, and CP feedback loop 112 previously described.

Method 200 may begin at operation 202, where testing metrics may be obtained. Testing metrics may be obtained by receiving testing metrics from a user or computer system. Further, testing metrics may be retrieved from a database. Obtaining testing metrics may include identifying testing metrics (e.g., based on device specifications, such as the power source), determining testing metrics, (e.g., calculating testing metrics based on observational data), generating testing metrics, or any other suitable method to obtain testing metrics.

The testing metrics may include one or more power thresholds. The testing metrics may be defined based on the power source and CC e-load specifications. Further, the testing metrics may be defined based on the measurement tools (e.g., voltage meter or power meter). In some embodiments, the testing metrics may be defined based on power source specifications and the typical environment in which the power source will be implemented.

For example, if the power source is a 12V battery used to back up storage systems, a user may define metrics commensurate with the typical operational requirements of the battery during backup. In this example, the storage system may require full power for a predefined period of time (e.g., 1400 W for 5 seconds), medium power for a predefined period of time (e.g., 1000 W for 10 seconds), and low power for a predefined period of time (e.g., 500 W for 15 seconds). In this example, the user may desire to test the battery at each power level for each predefined period of time. Accordingly, the user may define the power profile included in the testing metrics to be 1400 W for 5 seconds, 1000 W for 10 seconds, and 500 W for 15 seconds.

However, the testing metrics may also be obtained or determined based on the CC e-load or measurement tool specifications. For example, in some embodiments, the CC e-load may only be capable of drawing a certain amount of current from the power source. Accordingly, the power thresholds may be lowered to accommodate the CC e-load specifications. Further, in some embodiments, the measurement tools (e.g., voltage meters/power meters) may only be capable of measuring a threshold level of voltage or power (e.g., a lower limit and an upper limit). Accordingly, the metrics, including the one or more power thresholds, may be defined based on measurement tool testing limits.

Further, the testing metrics may be obtained by a processor. The processor may record operational metrics of the power source during use. The processor may then be configured to define testing metrics based on operational metrics of the power supply.

Additionally, testing metrics may be obtained based on testing inquiries. For example, if a battery is tested to determine energy depletion over time (e.g., a rechargeable battery), the power thresholds may be lowered periodically, to accommodate the drop in voltage over time. Further, testing inquiries may include testing battery failure or overheating (e.g., thermal runaway), and the power thresholds may be increased to accommodate the increase in output voltage over time.

Testing metrics may include allowances. For example, a user or processor may set an allowance on the measured power value required to satisfy a power threshold. This may be a percentage value (e.g., 0.1-5% of the defined power threshold) or a defined number of watts. In some embodiments, the allowance between the measured power value and power threshold may be 1% (e.g., if the defined power threshold is 100 W, the allowance range may be 99-101 W). If a measurement is found to be within the allowance of a threshold, the processor may consider the measurement to satisfy the threshold.

At operation 204, an estimated initial current level may be obtained. In some embodiments, the estimated initial current draw of the CC e-load may be determined based on the power source output voltage and predefined power thresholds. For example, if the power source is a 12V battery, and the power threshold is defined as 1000 W, the initial current draw to attain the power threshold may be obtained by dividing the power threshold by the output voltage, according to Equation (1) (e.g., 1000 W/12V=83.33 A). In some embodiments, a processor may determine the initial current draw of the CC e-load. The processor may obtain voltage measurements by a voltage meter, and use predefined power thresholds to determine the initial current draw level. In some embodiments, the processor may define power thresholds based on operational observations, and use power source specifications or measurements to determine the initial current draw. The estimated initial current level may be obtained in any suitable manner. In some embodiments, a user may set the initial current level.

At operation 206, a full iteration of the CP feedback loop may be implemented on the power supply. This may include testing the power supply at the predefined testing metrics, including the one or more power levels. An iteration may include implementing the CP feedback loop on each power threshold according to the predefined testing metrics. In some embodiments, an iteration run may be completed according to example method 300, as described with respect to FIG. 3.

At operation 208, the user or application may determine whether there are additional iterations left to run. In some embodiments, multiple iterations of the power profiles may be obtained to ensure the power source consistently performs adequately (e.g., satisfies the power thresholds). In some embodiments, multiple iterations may be obtained to determine whether or when the power source fails. Further, in some embodiments, multiple iterations may be obtained to determine the energy capacity and depletion of a power source over time.

For example, a large number (e.g., at least 10) of iterations may be run to determine whether a battery is susceptible to thermal runaway. Thermal runaway may occur as the voltage increases in a battery uncontrollably. As the temperature of the battery increases due to its internal resistance, the voltage increases due to the reaction kinetics. Likewise, as the voltage output increases, the temperature of the battery may also increase, much like an uncontrolled positive feedback loop. Obtaining a large number of iterations at one or more predefined power threshold(s) may be used to determine the point (e.g., voltage, time, temperature) at which the battery undergoes thermal runaway. This may help define safety parameters for future iterations.

In some embodiments, batteries (e.g., rechargeable) may be tested to determine their energy capacity and depletion time. In these embodiments, multiple iterations may be completed until the battery energy is depleted. In some embodiments, each iteration may involve a full depletion of a battery. In these embodiments, multiple iterations may be completed in order to determine how the battery responds to a number of cycles (e.g., determine how many full cycles the battery can go through before energy depletion). Any suitable number of iterations may be obtained, which may depend on testing inquiries and power source selection.

If there are no additional iterations, method 200 may end. However, if there are additional iterations, at operation 210, the initial current level for the next iteration may be determined based on the previous iteration. For example, if the first iteration concluded with a final voltage value of 11.5V, this voltage value may be used to determine the initial current draw of the next iteration. In this example, if the power threshold is set to 1000 W, the 11.5V voltage value from the first iteration may be used to determine that the next initial current draw should be ~87 A, according to Equation (1) (e.g., 1000 W/11.5V=86.96 A).

The aforementioned operations may be completed under a set of safety parameters. For example, safety parameters may include defining minimum and maximum limits on temperature, voltage, current, power, and the like throughout method 200. Each device in the system may have its own safety parameters. For example, the CC e-load may have safety parameters that define its maximum acceptable temperature and/or current drawn. Likewise, the power supply may have its own safety parameters defining its maximum acceptable temperature and/or voltage. If safety parameters are breached throughout method 200, a processor may be configured to stop the current iteration. For example, if the temperature of the power source exceeds defined safety parameters (e.g., 120° F.), the processor may be configured to lower the current drawn. In some embodiments, the processor may set the current drawn from the CC e-load to 0 A. For example, the processor may be configured to drop the current drawn by a predetermined amount if the power supply exceeds 120° F., and set the current drawn to 0 A if the temperature of the power supply exceeds 140° F. Further, a user may manually monitor safety parameters and end method 200 (e.g., set current draw from the CC e-load to 0 A and unplug all connections) if safety parameters are breached. This may prevent harm to humans and testing equipment.

The aforementioned operations may be completed in any order and are not limited to those described. Additionally, some, all, or none of the aforementioned operations may be completed, while still remaining within the spirit and scope of the present invention.

Figure 3:
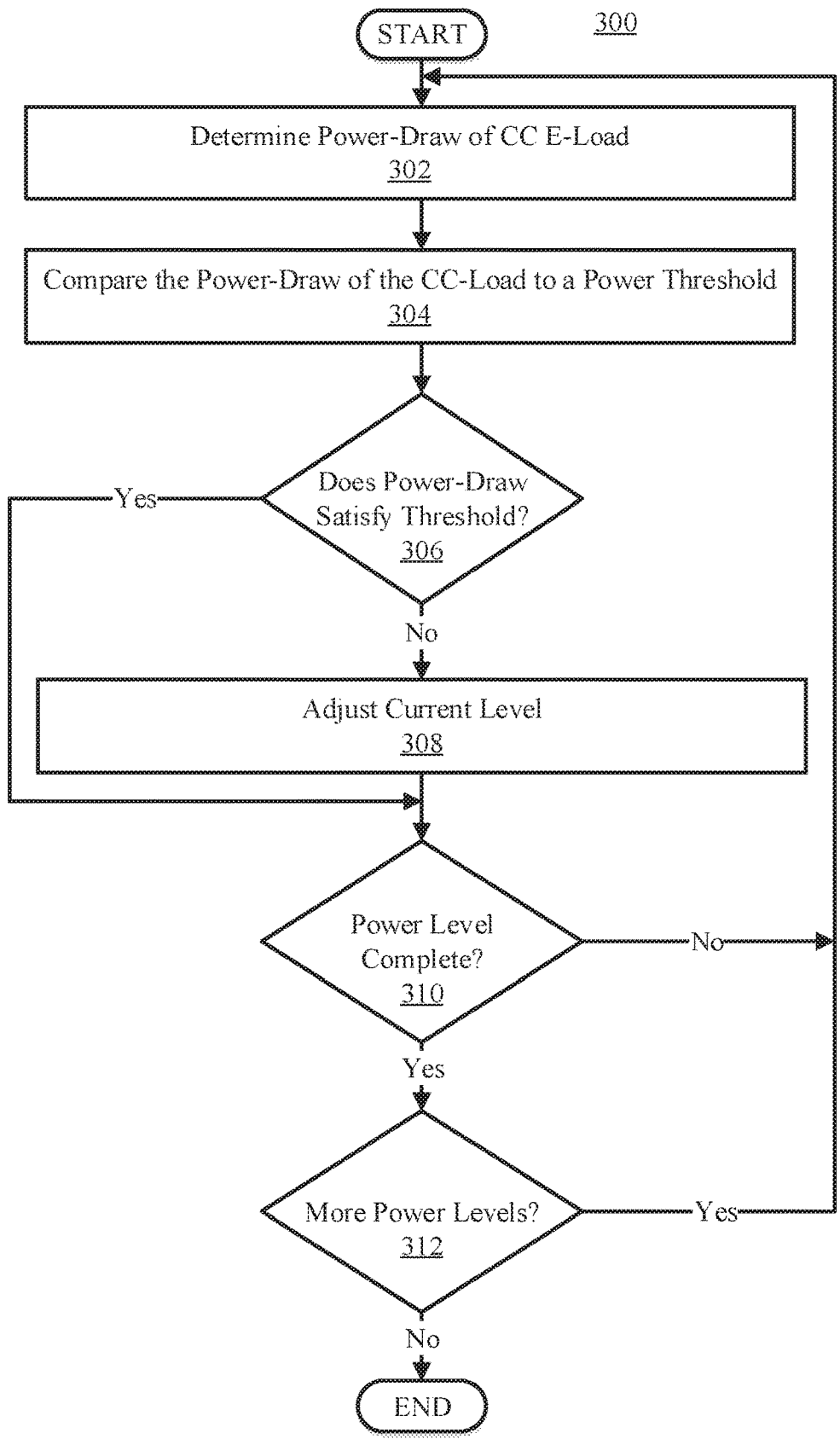
FIG. 3 illustrates a flowchart of an example method for implementing a CP feedback loop over one or more power threshold(s) using a CC e-load connected to a power source, in accordance with embodiments of the present disclosure.

FIG. 3 illustrates a flowchart of an example method 300 for implementing a CP feedback loop over one or more power threshold(s) on a CC e-load connected to a power source, in accordance with embodiments of the present disclosure. The example method 300 may be performed by a processor. In some embodiments, one or more operations of method 300 may be performed by a user, or by the processor in response to user input. The CC e-load, power source, voltage meter, power meter, and CP feedback loop may be substantially the same as the CC e-load 104, power source 102, voltage meter 106, power meter 108, and CP feedback loop 112 previously described.

Example method 300 may start at operation 302, where the power draw of the CC e-load may be determined. The power draw may be determined based on the measurement tool. For example, if a power meter is used, the power draw may be read directly from the power meter to determine the power draw. However, if a voltage meter is used, a user or processor may determine an inferred power draw based on the voltage measurement and the current drawn from the CC e-load. For example, if the initial CC e-load current draw is set to 100 A, and the voltage measured from the voltage meter is 10V, the inferred power draw may be determined by multiplying the current and the voltage, according to Equation (1) (e.g., 1000 W=100 A×10V).

At operation 304, the measured or inferred power draw may be compared to one of the one or more defined power thresholds. The processor may be configured to output various aspects of the comparison, including whether the measured power is greater than, less than, or equal to the defined power threshold, and a magnitude of the difference in each case (e.g., percentage or number of watts).

After the comparison, at operation 306, the processor or user may determine whether the measured/inferred power level satisfies the defined power threshold. In some embodiments, satisfying the power thresholds may be determined based on whether the measured/inferred power is equal to the power threshold.

Alternatively, allowances may be used to determine whether the measured/inferred power value satisfies the power threshold. For example, if the error allowance is defined as ±1%, and the power thresholds include 500 W, 1000 W, and 1400 W, the acceptable range of power measurements to satisfy the thresholds would be 495-505 W, 990-1010 W, and 1386-1414 W, respectively. Likewise, a power value (e.g., watts) allowance may be used to determine whether the measured power value satisfies the power threshold. In this example, if the error allowance is defined as ±2 W, and the power thresholds include 500 W, 1000 W, and 1400 W, the acceptable range of power measurements to satisfy the thresholds would be 498-502 W, 998-1002 W, and 1398-1402 W, respectively.

If the power thresholds are satisfied (e.g., the measured power is within the defined allowance), method 300 may move forward to operation 310, to determine whether the power level run is complete. If the power threshold is not satisfied (e.g., the measured power falls outside of the defined allowance), the method 300 may move forward to operation 308, where the current level of the CC e-load may be adjusted depending on the comparison between the measured/inferred power and the power threshold.

At operation 308, the current level of the CC e-load may be adjusted to alter the power draw of the CC e-load to approach the power threshold. In some embodiments, the current level of the CC e-load may be adjusted based on the measured power. In an example, the power threshold may be 1000 W, the measured power may be 1040 W, the power threshold error allowance may be ±1%, and the initial current level may be set to 100 A. In this example, the measured power falls outside of the range of the ±1% allowance on the 1000 W power threshold (e.g., 1040 W>1010 W). Accordingly, the current level may be adjusted at operation 308. In this example, the current level may be decreased based on the increase in power level (e.g., due to voltage increase). The new current level may be determined by multiplying the previously obtained current level by the ratio of the power threshold to the measured power, according to Equation (2) below.

$$I_{i+1}=I_i \times (P_t/P_m)$$ Equation (2)

Referring to Equation (2), $L_{i+1}$ is the new current level, $I_i$ is the previously obtained current value, $P_t$ is the power threshold, and $P_m$ is the measured power. Therefore, following Equation (2), the next current value is 96.15 A (e.g., 100 A×(1000 W/1040 W)=96.15 A).

The new current level obtained from Equation (2) may be subtracted from the initial current level, to determine the current adjustment, according to Equation (3) below.

$$I_a=I_{i+1}-I_i$$ Equation (3)

Therefore, following Equation (3), the current adjustment applied to the previously obtained current value is −3.85 A (e.g., 96.15 A−100 A=−3.85 A). This adjustment may be implemented to match measured power level with the desired power threshold.

However, there may be various approaches to adjusting the CC e-load current level to equate the measured power to the power threshold. In some embodiments, the CC e-load current draw may be adjusted based on voltage measurements. In an example, the power threshold may be 1000 W, the measured voltage may be 9.6V, the power threshold error allowance may be ±10 W, and the initial current level may be set to 100 A. An inferred power measurement may be obtained by multiplying the measured voltage by the current level, according to Equation (1) (e.g., 9.6V×100 A=960 W). Accordingly, the measured power draw does not satisfy the power threshold error allowance (e.g., 960 W<990 W), and the current may be adjusted according to operation 308. The current level of the CC e-load may be increased based on the decrease in voltage, as they have a direct relationship. In this example, the new current level may be determined according to Equation (2), by using the inferred power as the measured power in Equation (2) (e.g., 100 A×(1000 W/960 W)=1.04 A). The current adjustment may then be determined based on the new current level according to Equation (3) (e.g., 104.16 A−100 A=+4.16 A). This adjustment may be implemented to match the measured power to the target power threshold.

Further, current adjustments may be issued based on the past power draw measurements and the rate of change of the power draw. In some embodiments, the CP feedback loop may issue current adjustments similar to a PID controller (e.g., with proportional, integral, and derivative adjustment actions). In other words, a processor may consider not only the most recent power draw measurements, but previous power draw measurements to determine an appropriate current adjustment to issue. For example, the determined current adjustment may be based on the present error (e.g., a proportional component), past errors (e.g., an integral component), and the current rate of change (e.g., a derivative component). Each component may also be weighted using weighting factors set by a user or determined automatically by the processor using historical testing data. In some embodiments, the processor may alter the weighting factors dynamically (e.g., during a testing period). For example, the processor may determine that the error is increasing, or that the error is not decreasing at a fast enough rate, and may adjust the weighting factors of one or more of the proportional, derivative, and/or integral components automatically. Any suitable combination of proportional, integral, and derivative adjustments may be administered. In some embodiments, the CP feedback loop may only include proportional and integral action (e.g., PI control). In some embodiments, only one of proportional, integral, or derivative current feedback may be issued.

At operation 310, a user or processor may determine whether the power level is complete. The power level may be determined to be complete based on obtained testing metrics (e.g., run time). For example, if the run time for a power level is set for 5 seconds, the power level testing may be complete after 5 seconds. However, in some embodiments, determining whether the power level is complete may be based on observations. For example, if a battery is not performing sufficiently at the specified power level, the user may extend the runtime of the power threshold. If the power level is complete, method 300 may move onto operation 312, where the user or processor may determine whether there are additional power levels. If the power level is not complete, operation 310 may move back to operation 302, where the power draw is determined.

At operation 312, the user or processor may determine whether there are additional power levels. Additional power levels may be determined according to obtained testing metrics. For example, if there are three defined power thresholds (e.g., 500 W, 1000 W, 1400 W), the user may determine that there are additional power thresholds if all three power thresholds are not complete. Further, additional power levels may be determined based on run observations. For example, if a battery testing inquiry is energy depletion over time, and the voltage of the battery drops significantly over time, a user may add an additional power level with a lower power threshold. However, additional power levels may be determined in any suitable manner.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

For example, in some embodiments, operation 306 may not be performed. In these embodiments, the measured/inferred power may be compared to the power threshold, and a processor may send a current adjustment regardless of the comparison. For example, even if the measured/inferred power is equal to the power threshold, a processor may be configured to send a current adjustment of ±0 A.

FIG. 4 illustrates an example data run completed by an application implementing a CP feedback loop with measurements obtained by a voltage meter. The power source under test in FIG. 4 may be a battery with an increasing voltage over time due to the battery heating up. The CC e-load, power source, voltage meter, voltage measurement, computer system, CP feedback loop, and current adjustment may be substantially the same as the CC e-load 104, power source 102, voltage meter 106, voltage measurement 116, computer system 110, CP feedback loop 112, and current adjustment 120 previously described.

The data run may be completed according to the defined power profile. In this example, the power profile may be defined in the first three columns of the data table (e.g., time, sampling rate, and power thresholds). In some embodiments, a user or computer system defines/determines the power profile. The power source may be tested at each power threshold over predefined periods of time. Further, time intervals for obtaining measurements and issuing adjustments may be based on sampling rates.

The CP feedback loop run may include varying sampling rates. Sampling rates may be altered to change the frequency in which data measurements/adjustments are obtained/issued. As depicted in FIG. 4, the sampling rate may be measured in a number of samples per second. Accordingly, defining a 1.00 sample rate may result in obtaining data metrics every second. Likewise, defining a sampling rate of 2.00 may result in obtaining data metrics every 0.50 seconds, and defining a 4.00 sampling rate may result in obtaining data metrics every 0.25 seconds. Though sampling rate may be defined when obtaining testing metrics, sampling rate may also be adaptively altered throughout a test run. For example, if voltage is rapidly changing over a period of time, the sampling rate may be increased accordingly. This may increase the number of adjustments made per second, as adjustments may be implemented each time data samples are obtained. This may also reduce the variance of the measured/inferred power from the defined power threshold. Further, by adjusting the sampling rate according to the rate of change of the voltage of the power supply, the computer system may prevent dangerous test condition from occurring. For example, if the voltage of the power supply is rapidly increasing, the risk of the power supply voltage or temperature exceeding safe levels may increase. Accordingly, the sampling rate may increase so that the computer system is able to predict that the testing conditions will soon become unsafe, and adjust the power drawn (e.g., lower the CC e-load current) before the voltage or temperature exceeds safety thresholds.

Further, sampling rates may be adjusted depending on allowances and variance of the measured power from the power threshold. For example, if an error allowance for each power threshold is ±1%, and in each sample the measured power differs 5% from the power threshold, the sampling rate may be adjusted so that each sample is obtained when the measured power value is at the error allowance (e.g., 1%). In this example, if the voltage is linearly increasing or decreasing, the sampling rate may be increased by a factor of 5, so that power measurements are obtained when the power only differs 1% from the power threshold. This may allow a user to more accurately measure performance at predefined power thresholds.

Sampling rates may be adjusted based on the temperature of the CC e-load or power source. This may prevent breaching safety parameters, as temperature measurements may be obtained more frequently. For example, if a sampling rate is defined as 0.20 (e.g., one sample every 5 seconds), and temperature drastically increases within 5 seconds, a user or processor may not detect a safety parameter breach until the sample is obtained, which may be too late. However, if the sample rate is increased to 2, two temperature measurements may be obtained every second, which may provide an earlier indication that the temperature is unstable to the user or processor. This may allow a user or processor to preemptively take safety measures, before temperature is beyond a safety limit. Further, because the temperature and voltage of the power source may be closely related, adjusting the sampling rate based on the change in temperature may reduce the variance of voltage measurements. This may allow a user or processor to more accurately maintain the measured power closer to the power thresholds.

As previously mentioned, multiple power thresholds may be defined depending on various factors, including the power supply under test, the typical work load on the power supply, testing inquiries, and the like. In the example depicted in FIG. 4, defined power thresholds for the battery include 1,400 W, 1,000 W, and 500 W. The power thresholds may be selected depending on the sampling rate, and vice versa. This may allow fine tuning current adjustments depending on the selected power threshold. Though the power thresholds correspond to sampling rates in FIG. 4, in some embodiments, the power thresholds may not correspond to sampling rates.

A voltage meter may be connected to the power source to obtain voltage measurements. Further, the voltage meter may be communicatively coupled to a computer system to transmit the measurements to the computer system. As depicted in FIG. 4, the measured voltage increases from 10.0V to 12.4V in 7 seconds. This may result from the battery heating up as reaction kinetics increase within the power cells. Because voltage is measured instead of power, an inferred power may be calculated depending on the measured voltage and defined current draw for power threshold comparisons.

The initial current value at t=0 s (e.g., 140 A), as seen in the example on FIG. 4, may be based on the specifications of the power source. For example, if the battery was charged to 10V prior to testing, the initial current draw may be obtained by dividing the power threshold by the voltage output the battery was charged to, according to Equation (1) (e.g., 1400 W/10V=140 A.)

The CP feedback loop may not send current adjustments to the CC e-load if voltage remains static over time. Alternatively, if voltage remains static over time, the CP feedback loop may transmit a current adjustment of ±0 A to the CC e-load. As depicted in FIG. 4, at, t=0 s, the inferred power matches the power threshold (e.g., 140 A×10V=1400 W). In this example, there may be no criteria to satisfy the power threshold, and the processor may send current adjustments regardless of the inferred power level. For example, the processor may send a current adjustment of ±0 A to the CC e-load, even though the inferred power is equal to the power threshold. However, in some embodiments, the criteria to satisfy the power threshold may be to determine whether the inferred power is equal to the measured power. In these embodiments, if the inferred power is equal to the power threshold, the processor may not send any current adjustment to the CC e-load.

As the voltage output of the battery increases, the processor may send current adjustments to the CC e-load to equate the inferred power to the power threshold. For example, at t=1 s, the voltage increases from 10.0V to 10.2V, while the current remains 140 A. Accordingly, the inferred power may be determined according to Equation (1) (e.g., 10.2V×140 A=1428 W). Because the inferred power is greater than the power threshold, the processor may be configured to decrease the current draw of the CC e-load. In this example, the new current value may be obtained according to Equation (2) (e.g., 140 A×(1400 W/1428 W)=137.25 A. The current adjustment to be made at t=1 s may then be determined according to Equation (3) (e.g., 137.25 A−140 A=−2.75 A). These algorithms may be repeated for each sample within each respective power level.

Initial current values in between power thresholds within the same iteration may be determined based on the previous voltage measurement. For example, in FIG. 4, the power threshold decreases from 1400 W to 1000 W at t=4 s. The processor may be configured to calculate the initial current value at this power level based on the previously received voltage reading (e.g., 10.8V at t=3 s) and the current power threshold, according to Equation (1) (e.g., 1000 W/10.8V=92.59 A).

FIG. 5 illustrates an example data run completed by an application implementing a CP feedback loop with measurements obtained by a power meter. The power source under test in FIG. 4 may be a battery, with a decrease in voltage over time due to energy depletion over time. The CC e-load, power source, voltage meter, voltage measurement, computer system, CP feedback loop, and current adjustment may be substantially the same as the CC e-load 104, power source 102, voltage meter 106, voltage measurement 116, computer system 110, CP feedback loop 112, and current adjustment 120 previously described.

The data run may be completed according to the defined power profile. In this example, the power profile may be defined in the first three columns of the data table (e.g., time, sampling rate, and power thresholds). In some embodiments, a user or computer system defines/determines the power profile. The power source may be tested at each power threshold over predefined periods of time. Further, time intervals for obtaining measurements and issuing adjustments may be based on sampling rates.

The initial current value at t=0 s (e.g., 116.66 A), as seen on FIG. 5, may be estimated based on the specifications of the power source. For example, if the battery was charged to 12V prior to testing, the initial current draw may be obtained by dividing the power threshold by the voltage output the battery was charged to, according to Equation (1) (e.g., 1400 W/12V=116.66 A.)

Over time, the battery voltage may drop, and the CP feedback loop may be configured to increase the current draw to maintain a constant power. For example, at t=0 s, the measured power is 1395 W. The measured power (e.g., 1395 W) may be compared to the power threshold (e.g., 1400), to determine whether current adjustments should be made to match the measured power to the power threshold. In the example run depicted on FIG. 5, there is no criterion to satisfy the power threshold, so a processor may issue current adjustments regardless of the variance between the measured power and power threshold. The CP feedback loop may determine a new current for the next sample according to Equation (2) (e.g., 116.66 (A)×(1400/1395)=117.08 A). The current adjustment to be implemented at t=0 s may be determined according to Equation (3) (e.g., 117.08 A−166.66 A=0.42 A). Current adjustments may be similarly calculated for all other samples in each respective power threshold.

Inferred voltage values may be calculated at each time interval (e.g., sample) according to the measured power and defined current levels. For example, at t=1 s, the inferred voltage may be calculated, according to Equation (1) (e.g., 1397 W/117.08 A=11.93V). Inferred voltage values may be used to determine future initial current estimations. Further, inferred voltage values may indicate issues with the power supply under test.

Initial current values in between power thresholds within the same iteration may be determined based on the previously obtained voltage inferences. For example, in FIG. 5, the power threshold decreases from 1000 W to 500 W at t=6 s. The processor may be configured to calculate the initial current value at the next power level (e.g., 500 W) based on the previously received voltage inference (e.g., 11.58V at t=5.5 s) and the current power threshold, according to Equation (1) (e.g., 1000 W/10.8V=92.59 A).

Figure 6:
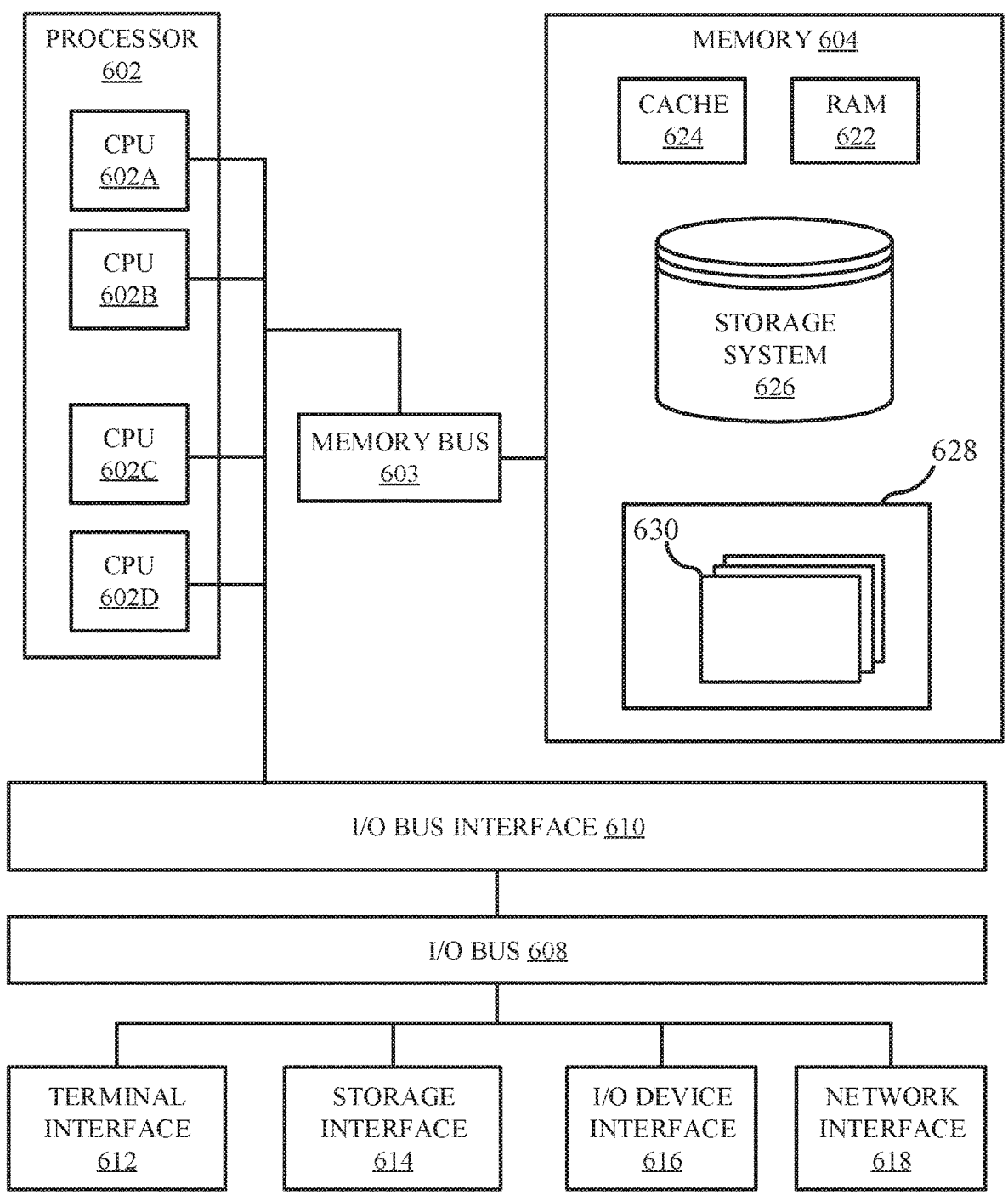
FIG. 6 depicts a high-level block diagram of an example computer system that may be used in implementing one or more of the methods, tools, and modules, and any related functions, described herein (e.g., using one or more processor circuits or computer processors of the computer), in accordance with embodiments of the present disclosure.

Referring now to FIG. 6, shown is a high-level block diagram of an example computer system 601 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 601 may comprise one or more CPUs 602, a memory subsystem 604, a terminal interface 612, a storage interface 614, an I/O (Input/Output) device interface 616, and a network interface 618, all of which may be communicatively coupled, directly or indirectly, for inter-component communication via a memory bus 603, an I/O bus 608, and an I/O bus interface unit 610.

The CC e-load, power source, voltage meter, voltage measurement, computer system, CP feedback loop, and current adjustment may be substantially the same as the CC e-load 104, power source 102, voltage meter 106, voltage measurement 116, computer system 110, CP feedback loop 112, and current adjustment 120 previously described. FIG.

6 may describe aspects of the computer system 110 depicted in FIG. 1. Further, the CP feedback loop 112 depicted in FIG. 1 may be described in association with one or more applications/modules located in the memory subsystem 604.

The computer system 601 may contain one or more general-purpose programmable central processing units (CPUs) 602A, 602B, 602C, and 602D, herein generically referred to as the CPU 602. In some embodiments, the computer system 601 may contain multiple processors typical of a relatively large system; however, in other embodiments the computer system 601 may alternatively be a single CPU system. Each CPU 602 may execute instructions stored in the memory subsystem 604 and may include one or more levels of on-board cache.

System memory 604 may include computer system readable media in the form of volatile memory, such as random access memory (RAM) 622 or cache memory 624. Computer system 601 may further include other removable/non-removable, volatile/non-volatile computer system storage media. By way of example only, storage system 626 can be provided for reading from and writing to a non-removable, non-volatile magnetic media, such as a "hard-drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 604 can include flash memory, e.g., a flash memory stick drive or a flash drive. Memory devices can be connected to memory bus 603 by one or more data media interfaces. The memory 604 may include at least one program product having a set (e.g., at least one) of program modules that are configured to carry out the functions of various embodiments.

One or more programs/utilities 628, each having at least one set of program modules 630 may be stored in memory 604. The programs/utilities 628 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs 628 and/or program modules 630 generally perform the functions or methodologies of various embodiments.

For example, in an embodiment of the present disclosure, the program modules 630 of the computer system 601 may include a data acquisition module. The data acquisition module may include computer instructions to fetch data from external devices communicatively coupled to the computer system 601 through the I/O device interface 616. External devices may include the CC e-load, the power meter, and the voltage meter. The data acquisition module may be configured to retrieve data from the external devices and may store the data in memory 604 to be used by the computer system 601.

The program modules 630 of the computer system 601 may include a CP feedback loop module. The CP feedback loop module may be configured to receive data obtained from the data acquisition module. Further, the CP feedback loop module may include computer instructions to transmit current adjustments to the CC e-load based on data received from the data acquisition module.

In some embodiments, the CP feedback loop module may include computer instructions to compare the measured power draw of the CC e-load to one or more power thresholds. The CP feedback loop may include computer instructions to determine the difference between the measured power and power threshold (e.g., percentage or power difference). Based on the difference between the measured power and the power threshold, the CP feedback loop may include computer instructions to calculate a current adjustment to transmit to the CC e-load to approach the measured power to the power threshold.

In some embodiments, the CP feedback loop module may send current adjustments in response to not satisfying a power threshold. For example, satisfying a power threshold may include determining whether the measured power falls within an allowance range, or determining whether the measured power is equal to the power threshold. If the power threshold is not satisfied, the CP feedback loop module may include computer instructions to send a new current level to the CC e-load. The new current level may be based on previous current level and a calculated current adjustment value. If the power threshold is satisfied, the CP feedback loop module may include computer instructions to not send a current adjustment to the CC e-load.

In some embodiments, the CP feedback loop module may continually transmit current adjustments to the CC e-load, independent of the comparison between the measured power and power threshold. For example, if the measured power is equal to the power threshold, the CP feedback loop module may be configured to send a current adjustment of ±0 A.

The program modules 630 of the computer system 601 may further include an output module. The output module may include computer instructions to report the run iteration(s) completed by the CP feedback loop module to a user. This may provide the user information regarding the performance of the power source at the power threshold(s).

Although the memory bus 603 is shown in FIG. 6 as a single bus structure providing a direct communication path among the CPUs 602, the memory subsystem 604, and the I/O bus interface 610, the memory bus 603 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 610 and the I/O bus 608 are shown as single respective units, the computer system 601 may, in some embodiments, contain multiple I/O bus interface units 610, multiple 110 buses 608, or both. Further, while multiple I/O interface units are shown, which separate the I/O bus 608 from various communications paths running to the various I/O devices, in other embodiments some or all of the I/O devices may be connected directly to one or more system I/O buses.

In some embodiments, the computer system 601 may be a multi-user mainframe computer system, a single-user system, or a server computer or similar device that has little or no direct user interface, but receives requests from other computer systems (clients). Further, in some embodiments, the computer system 601 may be implemented as a desktop computer, portable computer, laptop or notebook computer, tablet computer, pocket computer, telephone, smart phone, network switches or routers, or any other appropriate type of electronic device.

It is noted that FIG. 6 is intended to depict the representative major components of an exemplary computer system 601. In some embodiments, however, individual components may have greater or lesser complexity than as represented in FIG. 6, components other than or in addition to those shown in FIG. 6 may be present, and the number, type, and configuration of such components may vary.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A method comprising:
    obtaining, by a processor, testing metrics for a power source to be tested, wherein the testing metrics include a power threshold;
    obtaining an initial current level for a constant current electronic load (e-load);
    determining, by the processor, power-draw of the constant current e-load connected to the power source;
    comparing the power-draw to the power threshold; and
    adjusting, in response to the power-draw not satisfying the power threshold, the current level of the constant current e-load based on the power-draw and the power threshold, wherein the current level is adjusted such that the power-draw approaches the power threshold.

2. The method of claim 1, wherein power-draw is determined by a power meter.

3. The method of claim 1, wherein power-draw is determined by a voltage meter.

4. The method of claim 1, wherein the testing metrics include a sampling rate, and wherein the power-draw of the constant current e-load is output according to the sampling rate.

5. The method of claim 4, wherein the sampling rate is adjusted based on the power-draw.

6. The method of claim 4, wherein the sampling rate is adjusted based on the power threshold.

7. The method of claim 4, wherein an error is calculated between the power-draw and the one or more power thresholds, wherein the error is output according to the sampling rate, and wherein each of the one or more power thresholds has an error allowance.

8. The method of claim 7, wherein the testing metrics further include a power profile, wherein the power profile includes a period of time to test the power threshold, wherein testing the power profile constitutes an iteration, wherein one or more iterations are completed, the method further comprising:
    determining that the power-draw exceeds the error allowance; and
    adjusting, in response to determining that the power-draw exceeds the error allowance, the sampling rate such that the power-draw approaches the error allowance.

9. A computer program product comprising a non-transitory computer readable storage medium having program instructions embodied therewith, the program instructions executable by a processor to cause the processor to perform a method comprising:
    obtaining testing metrics for a power source to be tested, wherein the testing metrics include a power threshold;
    obtaining an initial current level for a constant current electronic load (e-load);
    determining a power-draw of the constant current e-load connected to the power source;
    comparing the power-draw to the power threshold; and
    adjusting, in response to the power-draw not satisfying the power threshold, the current level of the constant current e-load based on the power-draw and the power threshold, wherein the current level is adjusted such that the power-draw approaches the power threshold.

10. The computer program product of claim 9, wherein the current level is adjusted such that the power-draw approaches the power threshold based on a rate of change of the power-draw.

11. The computer program product of claim 9, wherein the testing metrics include a sampling rate, and wherein the power-draw of the constant current e-load is output according to the sampling rate.

12. The computer program product of claim 11, wherein the sampling rate is adjusted based on the power-draw.

13. The computer program product of claim 11, wherein an error is calculated between the power-draw and the power threshold, wherein the error is output according to the sampling rate, and wherein the power threshold has an error allowance.

14. A system comprising:
a constant current electronic load (e-load);
a power source connected to the constant current e-load; and
a processor communicatively coupled to the constant current e-load, wherein the processor is configured to perform a method comprising:
obtaining testing metrics for the power source, wherein the testing metrics include a power threshold;
obtaining an initial current level for the constant current e-load;
determining power-draw of the constant current e-load connected to the power source;
comparing the power-draw to the power threshold; and
adjusting, in response to the power-draw not satisfying the power threshold, the current level of the constant current e-load based on the power-draw and the power threshold, wherein the current level is adjusted such that the power-draw approaches the power threshold.

15. The system of claim 14, wherein the testing metrics include a sampling rate, and wherein the power-draw of the constant current e-load is output according to the sampling rate.

16. The system of claim 15, wherein the sampling rate is adjusted based on the power-draw.

17. The system of claim 15, wherein an error is calculated between the power-draw and the power threshold, wherein the error is output according to the sampling rate, and wherein the power threshold has an error allowance.

18. The system of claim 17, wherein the constant current level is adjusted based on a sum of the error output received according to the sampling rate.

19. The system of claim 17, wherein the testing metrics further include a power profile, wherein the power profile includes a period of time to test the power threshold, wherein testing the power profile constitutes an iteration, wherein one or more iterations are completed, the method further comprising:

determining that the power-draw exceeds the error allowance; and adjusting, in response to determining that the power-draw exceeds the error allowance, the sampling rate such that the power-draw approaches the error allowance.

20. The system of claim 14, wherein the power draw is determined by a power meter.

* * * * *